United States Patent
Choi et al.

(10) Patent No.: US 8,866,145 B2
(45) Date of Patent: Oct. 21, 2014

(54) ORGANIC LIGHT-EMITTING DISPLAY DEVICE INCLUDING AN INSULATING LAYER HAVING DIFFERENT THICKNESSES

(75) Inventors: Bo-Kyung Choi, Yongin (KR); Kyu-Sik Cho, Yongin (KR); Sang-Ho Moon, Yongin (KR); Joon-Hoo Choi, Yongin (KR); Chung-Gi You, Yongin (KR); Sun Park, Yongin (KR); Jong-Hyun Park, Yongin (KR); Yul-Kyu Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/200,373

(22) Filed: Sep. 23, 2011

(65) Prior Publication Data

US 2012/0097967 A1 Apr. 26, 2012

(30) Foreign Application Priority Data

Oct. 25, 2010 (KR) .................. 10-2010-0104242

(51) Int. Cl.
| | |
|---|---|
| *H01L 27/14* | (2006.01) |
| *H01L 29/04* | (2006.01) |
| *H01L 29/15* | (2006.01) |
| *H01L 31/036* | (2006.01) |
| *H01L 27/32* | (2006.01) |
| *H01L 51/52* | (2006.01) |
| *H01L 21/00* | (2006.01) |

(52) U.S. Cl.
CPC ......... *H01L 27/3262* (2013.01); *H01L 27/3265* (2013.01); *H01L 51/5265* (2013.01)
USPC .................. 257/72; 439/29; 439/34

(58) Field of Classification Search
USPC .................. 257/E33, 72; 438/29, 34
See application file for complete search history.

(56) References Cited

U.S. PATENT DOCUMENTS

| | | | | |
|---|---|---|---|---|
| 5,328,861 | A * | 7/1994 | Miyakawa .................. | 438/151 |
| 2003/0180991 | A1 * | 9/2003 | Seo et al. .................... | 438/151 |
| 2003/0181043 | A1 * | 9/2003 | Tanada et al. ............... | 438/689 |
| 2006/0175962 | A1 | 8/2006 | Fujimoto et al. | |
| 2010/0193790 | A1 * | 8/2010 | Yeo et al. .................... | 257/59 |
| 2011/0001139 | A1 | 1/2011 | Kim et al. | |

FOREIGN PATENT DOCUMENTS

| | | | | |
|---|---|---|---|---|
| JP | 2006-221976 A | 8/2006 | | |
| KR | 10-2005-0028567 A | * 3/2005 | ............ | H05B 33/22 |
| KR | 10-2005-0035806 A | 4/2005 | | |
| KR | 10-2009-0060851 A | 6/2009 | | |
| KR | 10-2009-0120698 A | 11/2009 | | |
| KR | 10-2011-0003201 A | 1/2011 | | |

* cited by examiner

*Primary Examiner* — Mamadou Diallo
*Assistant Examiner* — Jay C Chang
(74) *Attorney, Agent, or Firm* — Lee & Morse, P.C.

(57) ABSTRACT

An organic light-emitting display device includes a buffer layer on a substrate that has a plurality of insulating layers having different refractive indexes, and at least one of the insulating layers have different thicknesses on the same level. The device further includes an active layer of a thin film transistor in a thick area of the buffer layer, a pixel electrode in a thin area of the buffer layer, a gate electrode of the thin film transistor on the active layer and source and drain electrodes of the thin film transistor connected to the active layer, and a gate insulating layer between the gate electrode and the source and drain electrodes. The device also includes an emission layer on the pixel electrode, an opposite electrode facing the pixel electrode, and the emission layer is between the opposite electrode and the pixel electrode.

20 Claims, 5 Drawing Sheets

ORGANIC LIGHT-EMITTING DISPLAY DEVICE INCLUDING AN INSULATING LAYER HAVING DIFFERENT THICKNESSES

BACKGROUND

1. Field

Embodiments relates to an organic light-emitting display device and a method of manufacturing the same.

2. Description of the Related Art

Due to, e.g., wide viewing angles, fast response speeds, and low power consumption as well as small weight and size, organic light-emitting display devices may be regarded as next-generation display devices.

An organic light-emitting display device for realizing full color may use, e.g., an optical resonance structure. The optical resonance structure may vary an optical length of each wavelength of light emitted from an organic emission layer of each different pixel such as red, green, and blue pixels.

SUMMARY

Embodiments include an organic light-emitting display device, e.g., having excellent optical and device characteristics and being manufacturable through a simple process, and a method of manufacturing the organic light-emitting display device.

Embodiments may be realized by providing an organic light-emitting display device including a buffer layer disposed on a substrate and including a plurality of insulating layers having different refractive indexes. At least one of the insulating layers is formed to have different thicknesses on the same level. The device includes an active layer of a thin film transistor formed in a thick area of the buffer layer, a pixel electrode formed in a thin area of the buffer layer, a gate electrode of the thin film transistor formed on the active layer and source and drain electrodes of the thin film transistor connected to the active layer. A gate insulating layer is formed between the gate electrode and the source and drain electrodes, an emission layer formed on the pixel electrode, and an opposite electrode facing the pixel electrode. The emission layer is formed between the opposite electrode and the pixel electrode.

From among the plurality of insulating layers, the layer formed to have different thicknesses may be an uppermost insulating layer of the buffer layer.

The uppermost insulating layer of the buffer layer may include a less amount of hydrogen than a layer formed under the uppermost insulating layer.

The active layer may include polysilicon, and the layer formed under the uppermost insulating layer of the buffer layer may be filled in a defect site of the polysilicon so as to cure defects.

The uppermost insulating layer and the layer formed under the uppermost insulating layer of the buffer layer may include silicon oxide and silicon nitride, respectively.

A cross-section of a thick area of the buffer layer may have the same shape as a cross-section of an etched surface of the active layer.

From among the plurality of insulating layers, adjacent insulating layers may have different refractive indexes.

The gate insulating layer may include layers having different refractive indexes.

From among the layers of the gate insulating layer, the layer contacting the active layer may have a less amount of hydrogen than another layer that does not contact the active layer.

The active layer may include polysilicon, and the layer that does not contact the active layer may be filled in a defect site of the polysilicon so as to cure defects.

From among the layers of the gate insulating layer, the layer contacting the active layer and the layer that does not contact the active layer may include silicon oxide and silicon nitride, respectively.

The pixel electrode may include a transparent electrode, and the opposite electrode may include a reflective electrode.

The organic light-emitting display device may further include a lower electrode of a capacitor, which may be formed of the same layer as the active layer and may be formed in the thick area of the buffer layer, and an upper electrode of a capacitor, which may be formed of the same layer as the gate electrode.

A cross-section of the lower electrode may have the same shape as a cross-section of an etched surface of the thick are of the buffer layer.

The lower electrode may include polysilicon, the layer contacting the lower electrode, from among the layers of the gate insulating layer, include a less amount of hydrogen than another layer that does not contact the lower electrode.

The layer contacting the lower electrode and the layer that does not contact the lower electrode may include silicon oxide and silicon nitride, respectively.

Embodiments may also be realized by providing a method of manufacturing an organic light-emitting display device. The method includes forming a buffer layer on a substrate and including a plurality of insulating layers having different refractive indexes. After forming a semiconductor layer on the buffer layer, forming an active layer by patterning the semiconductor layer and forming the buffer layer to be thicker in an area where the active layer is formed than in an area where the active layer is not formed. The method includes forming a gate insulating layer so as to cover the active layer, forming a pixel electrode in a thin area of the buffer layer on the gate insulating layer, and forming a gate electrode on the active layer between the gate insulating layer and the active layer. The method includes forming an interlayer insulating layer and forming an opening in the interlayer insulating layer so that the active layer and the pixel electrode are partially exposed. The method includes forming source and drain electrodes connected to the active layer, and covering the source and drain electrodes and forming a pixel defining layer having an opening exposing the pixel electrode.

When forming the buffer layer including the plurality of insulating layers having different refractive indexes on the substrate, an uppermost insulating layer of the buffer layer may be formed thicker than the other layers.

The uppermost insulating layer of the buffer layer may be formed to have different thicknesses on the same level.

The buffer layer may be etched to have different thicknesses by using the active layer as a mask.

When forming the active layer, a process for crystallizing amorphous silicon may be performed.

The gate insulating layer may include a plurality of layers having different refractive indexes.

The active layer and a capacitor lower electrode including the same material as the active layer may be simultaneously formed of the same layer, and the gate electrode and a capacitor upper electrode including the same material as the gate electrode may be formed of the same layer.

The buffer layer may be etched to have different thicknesses by using the lower electrode as a mask.

When forming the source and drain electrodes, the upper electrode may be partially removed, and ion impurities may be doped on the lower electrode.

BRIEF DESCRIPTION OF THE DRAWINGS

Features will become more apparent by describing in detail exemplary embodiments with reference to the attached drawings in which.

DETAILED DESCRIPTION

This application claims the benefit of Korean Patent Application No. 10-2010-0104242, filed on Oct. 25, 2010, in the Korean Intellectual Property Office, and entitled: "Organic Light-Emitting Display Device and Method of Manufacturing the Same," the disclosure of which is incorporated herein in its entirety by reference.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or element, or intervening layers or elements may also be present.

Now, an exemplary embodiment will be described in detail with reference to the accompanying drawings. An organic light-emitting display device 1 according to an exemplary embodiment and a method of manufacturing the same will now be described with reference to FIGS. 1 through 8.

FIGS. 1 through 8 are schematic cross-sectional views for illustrating an exemplary method of manufacturing the organic light-emitting display device 1. FIG. 9 is a schematic cross-sectional view illustrating the organic light-emitting display device 1 manufactured by using the method illustrated in FIGS. 1 through 8.

Figure 1:
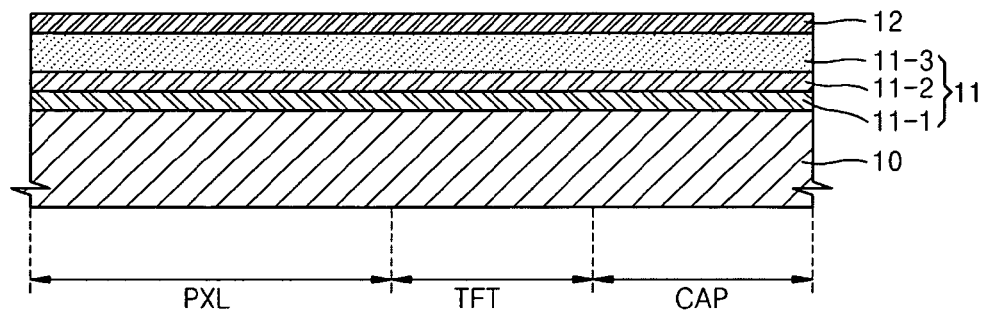
FIGS. 1 through 8 are schematic cross-sectional views illustrating a method of manufacturing an organic light-emitting display device, according to an exemplary embodiment.

Referring to FIG. 1, a buffer layer 11 may include insulating layers 11-1, 11-2, and 11-3 having different refractive indexes may be formed on a substrate 10. A semiconductor layer 12 may be sequentially formed on a substrate 10, e.g., on the buffer layer.

The substrate 10 may be formed of, e.g., a transparent glass or plastic material that may transmit light.

The insulating layers 11-1, 11-2, and 11-3 may each have different refractive indexes. The insulating layers 11-1, 11-2, and 11-3 may be sequentially formed on the substrate 10 to constitute the buffer layer 11. Referring to FIG. 1, the buffer layer 11 may be configured as a triple-layered structure, but embodiments are not limited thereto. For example, the buffer layer 11 may include at least two layers having different refractive indexes, or the buffer layer 11 may include more than three layers having different refractive indexes.

The uppermost insulating layer 11-3, from among the insulating layers 11-1, 11-2, and 11-3, may be thicker than the insulating layers 11-1 and 11-2, which will be described later.

The uppermost insulating layer 11-3 may be thicker in order to differentiate thicknesses of later formed elements, e.g., a pixel area PXL, a transistor area TFT, and a capacitor area CAP, on the same surface by etching the uppermost insulating layer 11-3.

The buffer layer 11 may minimize, reduce, and/or prevent permeation of impurities from the substrate 10 and may planarize a surface of the substrate 10.

The buffer layer 11 may include the plurality of insulating layers 11-1, 11-2, and 11-3 having different refractive indexes so that when light emitted from, e.g., an emission layer 118 (see FIG. 9), may passes through the substrate 10. The buffer layer 11 may function as a dielectric Bragg reflector (DBR) for maximizing a resonance effect, thereby improving a color reproduction range. The insulating layers 11-1, 11-2, and 11-3 may not necessarily have different refractive indexes, e.g., only the adjacent insulating layers may have different refractive indexes.

Also, the buffer layer 11 is related to an electrical property of an active layer 212 (see FIG. 3) of a thin film transistor (TFT) that is to be formed by patterning the semiconductor layer 12, which will be described later.

In order to achieve the above-described functions, the insulating layers 11-1, 11-2, and 11-3 constituting the buffer layer 11 may be formed of any of various materials. For example, the buffer layer 11 may be formed of silicon oxide, silicon nitride, silicon oxynitride, or the like.

The semiconductor layer 12 may be formed on the buffer layer 11. The buffer layer 11 and the semiconductor layer 12 may be deposited by using any of various deposition methods, such as plasma-enhanced chemical vapor deposition (PECVD), atmospheric pressure CVD (APCVD), or low-pressure CVD (LPCVD).

The semiconductor layer 12 may be, e.g., amorphous silicon or polysilicon. The polysilicon may be formed of by crystallizing the amorphous silicon. The amorphous silicon may be crystallized by using any of various methods, such as rapid thermal annealing (RTA), solid phase crystallization (SPC), excimer laser annealing (ELA), metal-induced crystallization (MIC), metal-induced lateral crystallization (MILC), or sequential lateral solidification (SLS).

Figure 2:
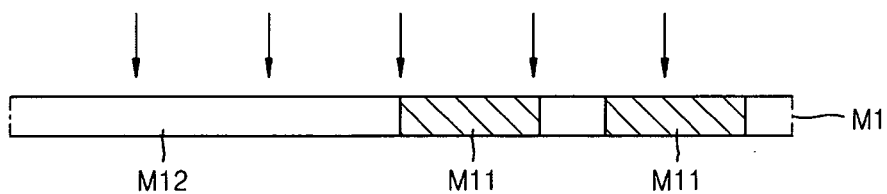
Figure 2:
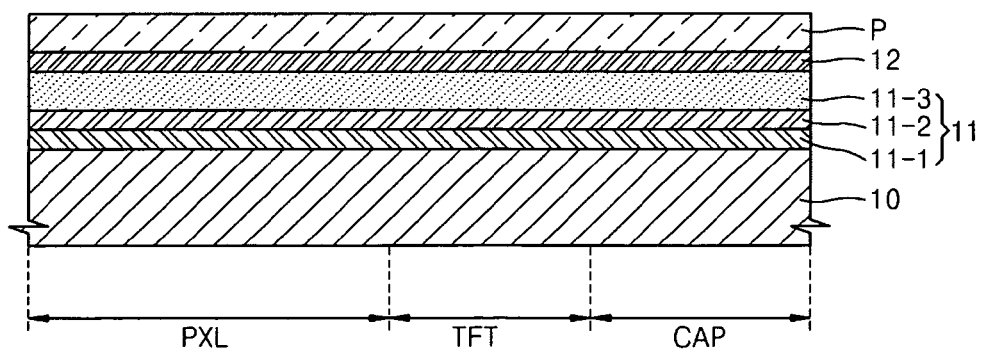

Referring to FIG. 2, a photoresist P may be deposited on the semiconductor layer 12. A first mask process may be performed by using a first photomask M1. The first photomask M1 may include light-shielding portions M11 and light-transmitting portions M12.

Although not shown in FIG. 2, the first photomask M1 may be exposed by using an exposing apparatus (not shown), and developing and etching processes are then performed.

Figure 3:
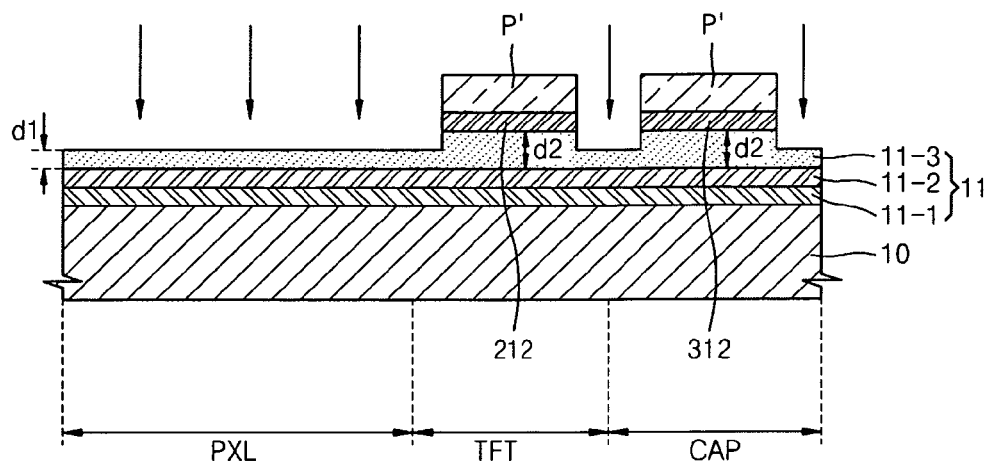

Referring to FIG. 3, as a result of the first photomask process, the semiconductor layer 12 may be exposed to be patterned as the active layer 212 of the TFT and a lower electrode 312 of a capacitor (hereinafter referred to as the capacitor lower electrode 312).

At this time, the uppermost insulating layer 11-3 of the buffer layer 11 may be etched to have a non-uniform thickness by using photoresists P' remaining on the respective active layer 212 and the capacitor lower electrode 312, as a mask. That is, thicknesses d2 of the uppermost insulating layer 11-3 of the buffer layer 11 contacting the active layer 212 and the uppermost insulating layer 11-3 contacting the capacitor lower electrode 312 may be greater than a thickness d1 of the uppermost insulating layer 11-3 of the pixel area PXL.

Without intending to be bound by this theory, when the semiconductor layer for forming the active layer 212 is formed of polysilicon, a high resolution display may be realized because the polysilicon has a greater mobility than the amorphous silicon. However, the polysilicon may have a defect, such as dangling bonds, in a crystal grain boundary, thereby deteriorating an electrical property of the organic light-emitting display device 1, e.g., a threshold voltage Vth of a TFT. The defect may be removed by providing hydrogen to a defect site of the active layer 212.

In the organic light-emitting display device 1 of an exemplary embodiment, an insulating layer having a great amount of hydrogen may be provided as at least one of the insulating layers 11-1, 11-2, and 11-3 constituting the buffer layer 11 disposed under the active layer 212 and the capacitor lower electrode 312. However, the insulating layer having a great amount of hydrogen may not be formed as a layer contacting the active layer 212 and the capacitor lower electrode 312. For example, the lower insulating layer 11-2 disposed under the uppermost insulating layer 11-3 may have a greater amount of hydrogen than the uppermost insulating layer 11-3 of the buffer layer 11. The uppermost insulating layer 11-3 may be formed of silicon oxide, and the lower insulating layer 11-2 may be formed of silicon nitride.

A material having a great amount of hydrogen, e.g., silicon nitride may reduce the threshold voltage Vth of a TFT by curing the defect site of the polysilicon, but may include a great amount of impurities and may be porous. Thus, when the silicon nitride directly contacts the active layer 212, the stability of the threshold voltage Vth may be affected. Accordingly, a protection layer may be disposed between the silicon nitride and the active layer 212, and silicon oxide having a less amount of hydrogen than the silicon nitride may be used as the protection layer. The protection layer may be formed to have a proper thickness. For example, when the protection layer has a thickness of more than about 1000 Å, the protection layer may function properly.

As an experimental example, the uppermost insulating layer 11-3 of the buffer layer 11 is formed of silicon oxide so as to have thicknesses of about 700 Å and about 3000 Å under the same conditions, and silicon nitride is formed under the uppermost insulating layer 11-3. In the experimental example, as a result of measuring of a variation of a threshold voltage, the variation of a threshold voltage is reduced about twice in a portion where the silicon oxide is thick compared to a portion where the silicon oxide is thin, thereby showing a stable electrical property of the organic light-emitting display device 1.

As described above, the uppermost insulating layer 11-3 formed of silicon oxide may be formed relatively thick in the transistor area TFT and the capacitor area CAP, and may be formed relatively thin in the pixel area PXL functioning as a DBR. Without intending to be bound by this theory, based on this configuration, a color reproduction range and an electrical property of the organic light-emitting display device may be improved.

As described above, since the uppermost insulating layer 11-3 is etched by using the active layer 212 and the capacitor lower electrode 312 as a mask, an additional mask process may not be necessary to etch the uppermost insulating layer 11-3. Cross-sections of etched surfaces of the uppermost insulating layer 11-3 and the active layer 212 may have the same shape as those of etched surfaces of the uppermost insulating layer 11-3 and the capacitor lower electrode 312.

After performing the etching process on the buffer layer 11, the photoresist P' remaining on the active layer 212 and the capacitor lower electrode 312 may be removed through a series of processes such as stripping or ashing.

In the current embodiment, the thickness of the buffer layer 11 may be controlled by etching the uppermost insulating layer 11-3, but embodiments are not limited thereto. For example, the thickness of the buffer layer 11 may be controlled by etching another layer instead of the uppermost insulating layer 11-3. However, in this case, the buffer layer 11 should be etched before forming the active layer 212 and the capacitor lower electrode 312, and thus an additional mask process may be necessary.

Figure 4:
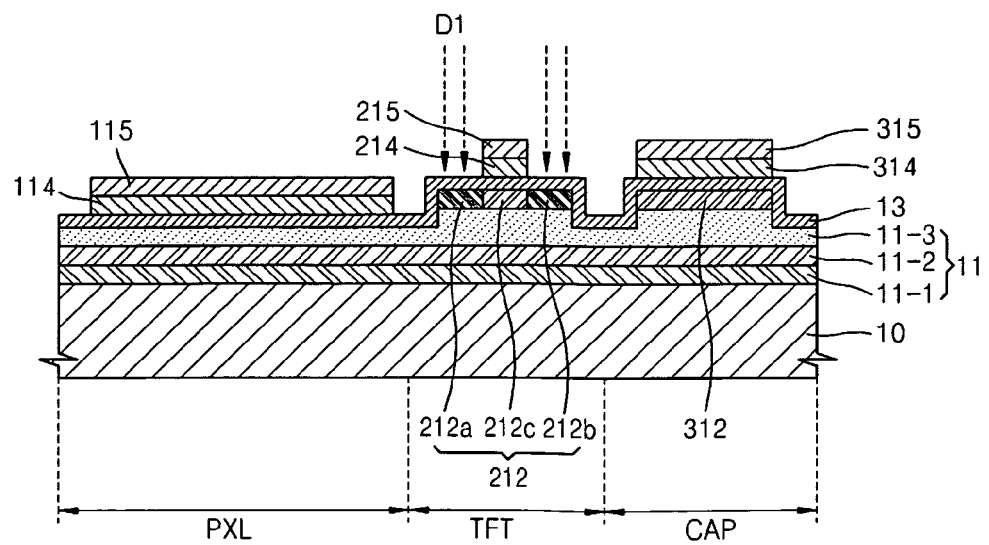

FIG. 4 is a schematic cross-sectional view illustrating a resultant after a second mask process is performed on the organic light-emitting display device 1.

Referring to FIG. 4, a gate insulating layer 13 may be stacked on the resultant of the first mask process of FIG. 3, and layers (not shown), including a transparent conductive material and a metal, may be sequentially stacked on the gate insulating layer 13. Then, the layers, including the transparent conductive material and the metal, are simultaneously patterned.

As a result of the patterning, a first pixel electrode 114 including a transparent conductive material and a second pixel electrode 115 including a metal may be sequentially formed on the gate insulating layer 13 in the pixel area PXL. That is, the first and second pixel electrodes 114 and 115 may be formed on the uppermost insulating layer 11-3 that is relatively thin. In addition, a first gate electrode 214 including a transparent conductive material and a second gate electrode 215 including a metal may be sequentially formed in the transistor area TFT. A capacitor first upper electrode 314 including a transparent conductive material and a capacitor second upper electrode 315 including a metal may be sequentially formed in the capacitor area CAP.

The gate insulating layer 13 may include at least one material selected from the group consisting of silicon oxide, silicon nitride, and silicon oxynitride. The gate insulating layer 13 may function as an insulating layer of the capacitor.

The first pixel electrode 114, the first gate electrode 214, and the capacitor first upper electrode 314 may be formed of the same transparent conductive material. The transparent conductive material may include at least one selected from the group consisting of indium tin oxide (ITO), indium zinc oxide (IZO), zinc oxide (ZnO), indium oxide (In2O3), indium gallium oxide (IGO), and aluminum zinc oxide (AZO).

The second pixel electrode 115, the second gate electrode 215, and the capacitor second upper electrode 315 may be formed of the same metal as a single layer or a multi-layered structure. The metal may include at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The above structure may be doped with ion impurities. The ion impurities may be, e.g., B or P ions. The active layer 212 may be doped with the B or P ions at a concentration of, e.g., more than $1 \times 10^{15}$ atoms/cm$^2$.

The active layer 212 may be doped with the ion impurities by, e.g., using the first and second gate electrodes 214 and 215 as a self-aligned mask. Thus, the active layer 212 may include source and drain areas 212a and 212b doped with ion impurities and a channel area 212c formed between the source and drain areas 212a and 212b. Since the first and second gate electrodes 214 and 215 are used as the self-aligned mask, the source and drain areas 212a and 212b may be formed without using an additional photo mask.

Figure 5:
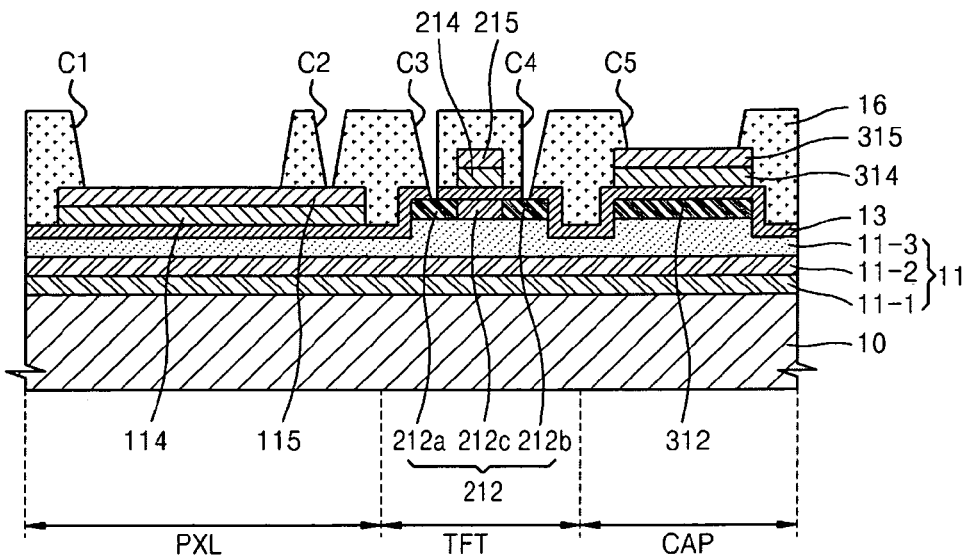

FIG. 5 is a schematic cross-sectional view illustrating a resultant after a third mask process is performed on the organic light-emitting display device 1.

Referring to FIG. 5, an interlayer insulating layer 16 may be stacked on the resultant of the second mask process of FIG. 4. Contact holes may be formed by patterning the interlayer insulating layer 16. First and second contact holes C1 and C2 may expose the first and second pixel electrodes 114 and 115. Third and fourth contact holes C3 and C4 may partially expose the source and drain areas 212a and 212b of the active layer 212. A fifth contact hole C5 may expose the uppermost of the first and second upper electrodes 314 and 315 of the capacitor.

Figure 6:
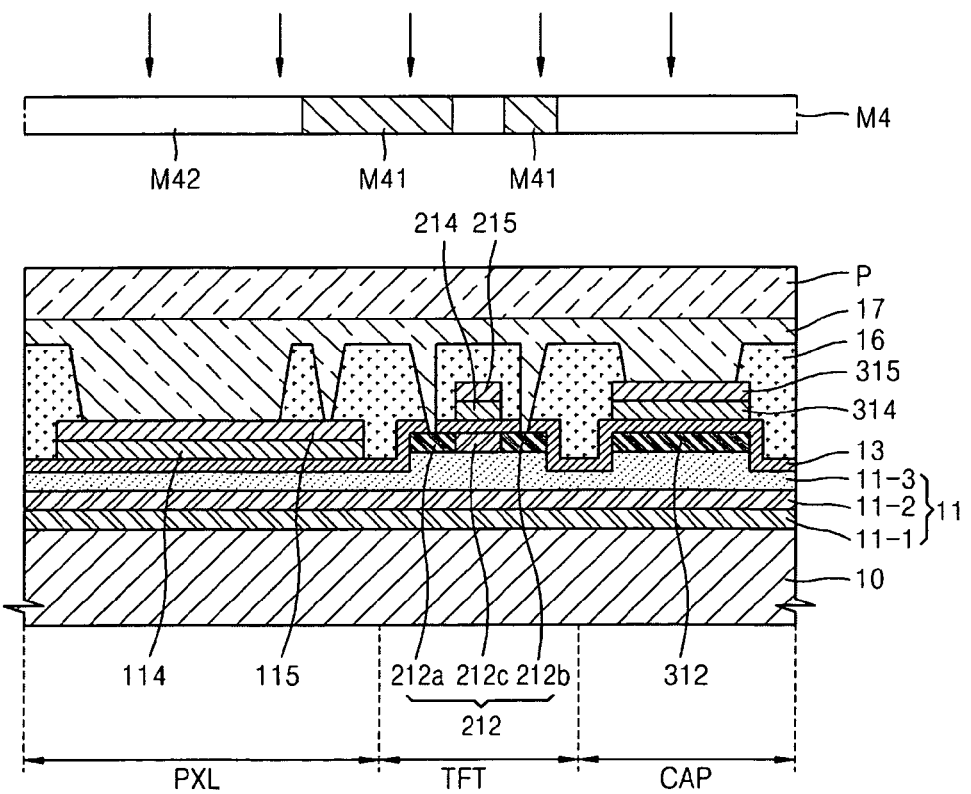
Figure 7:
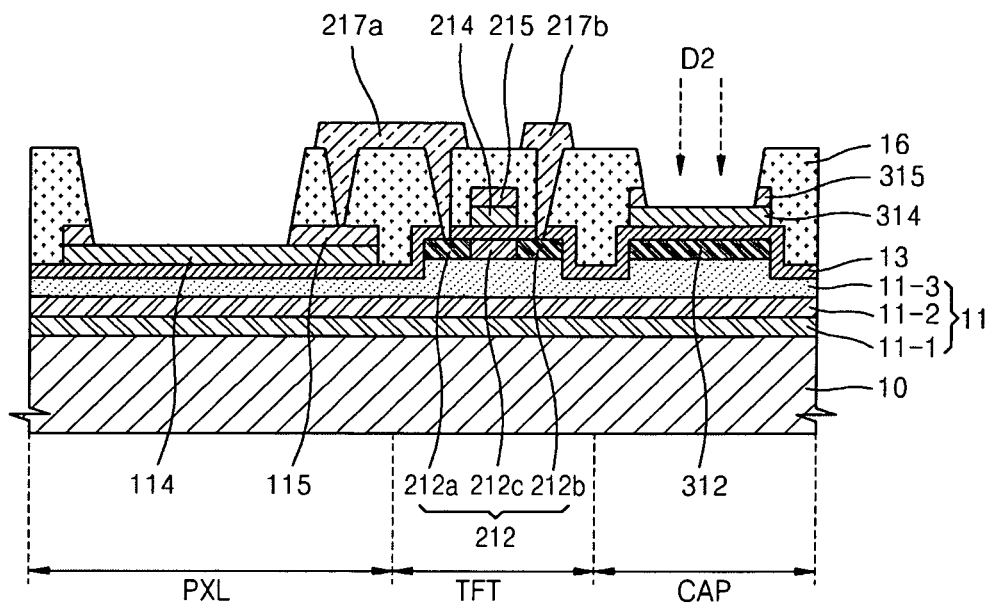

FIGS. 6 and 7 are schematic cross-sectional views illustrating resultants after a fourth mask process of the organic light-emitting display device 1.

Referring to FIG. 6, a metal layer 17, which may be a material layer for forming source and drain electrodes, may be formed on the resultant of the third mask process of FIG. 5. A photoresist P may be formed on the metal layer 17. Then, the fourth mask process may be performed by using a fourth photomask M4 including light-shielding portions M41 and light-transmitting portions M42.

Referring to FIG. 7, source and drain electrodes 217a and 217b may be formed on the interlayer insulating layer 16. The source and drain electrodes 217a and 217b may be formed of at least one metal selected from the group consisting of Al, Pt, Pd, Ag, Mg, Au, Ni, Nd, Ir, Cr, Li, Ca, Mo, Ti, W, and Cu. The source and drain electrodes 217a and 217b may be formed to have a single layer or multi-layered structure.

When the source and drain electrodes 217a and 217b are formed, both the second pixel electrode 115 and the capacitor second upper electrode 315 may be etched together. Here, when the source and drain electrodes 217a and 217b and the second pixel electrode 115 and the capacitor second upper electrode 315 are formed of the same metal, the source and drain electrodes 217a and 217b may be patterned through a single etching process using the same etchant. When the source and drain electrodes 217a and 217b and the second pixel electrode 115 and the capacitor second upper electrode 315 are formed of different metals, source and drain electrodes 217a and 217b patterns may be formed by etching the metal for forming the source and drain electrodes 217a and 217b by using a primary etching solution, and the second pixel electrode 115 and the capacitor second upper electrode 315 may be removed by using a secondary etching solution.

After performing the above-described etching process, ion impurities may be doped on the capacitor lower electrode 312. The capacitor may have a metal oxide semiconductor (MOS) CAP structure before the ion impurities are doped, and may have a metal-insulator-metal (MIM) CAP structure having an electrostatic capacity greater than the MOS CAP structure after the ion impurities are doped. Thus, the electrostatic capacity may be maximized. Even though the MIM CAP structure may have a smaller area than the MOS CAP structure, the MIM CAP structure may realize the same electrostatic capacity as that of the MOS CAP structure. Thus, as a margin for reducing the area of the capacitor is increased, the first pixel electrode 114 may be formed bigger, thereby increasing an aperture ratio.

Figure 8:
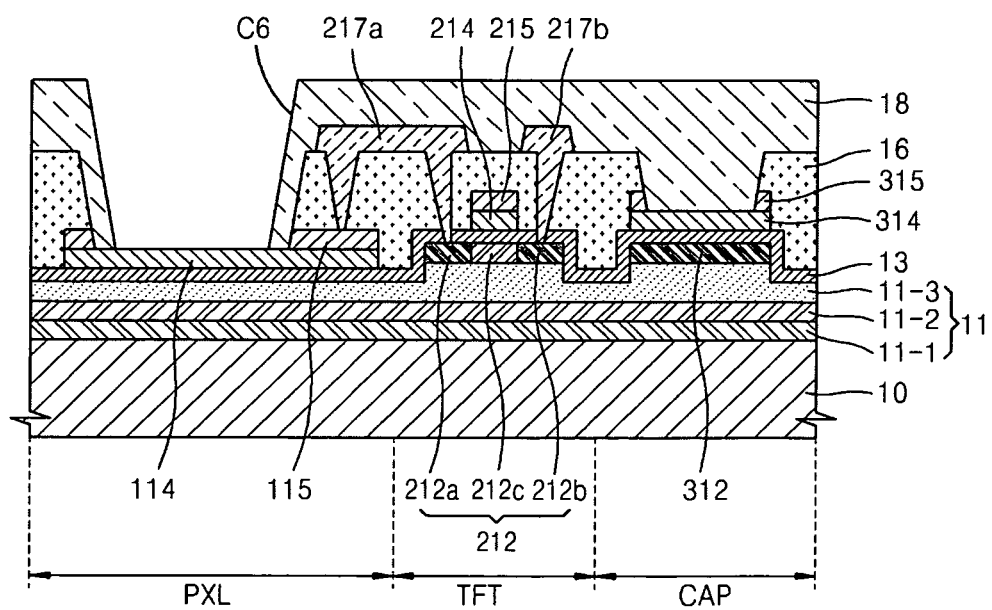
Figure 9:
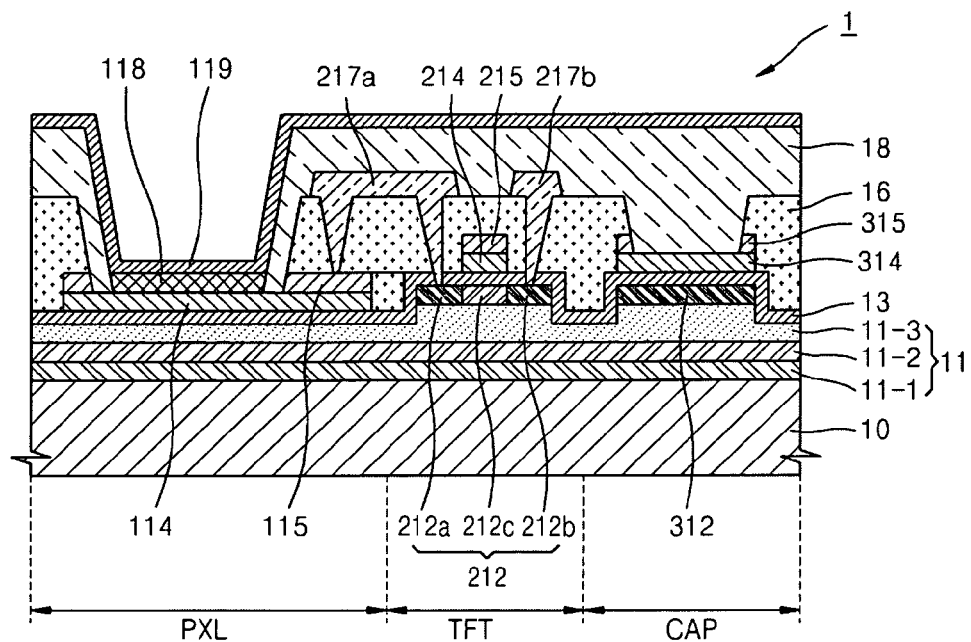
FIG. 9 is a schematic cross-sectional view illustrating the organic light-emitting display device manufactured by using the method illustrated in FIGS. 1 through 8.

FIG. 8 is a schematic cross-sectional view illustrating a resultant after a fifth mask process is performed on the organic light-emitting display device 1.

Referring to FIG. 8, an insulating layer 18 may be stacked on the resultant after the fourth mask process of FIG. 7 is performed. An opening C6 may expose an upper portion of the first pixel electrode 114. The opening C6 may be formed by patterning the insulating layer 18.

The opening C6 may define an emission area. The opening C6 may minimize, reduce, and/or prevent an electrical field from concentrating at an edge of the first pixel electrode 114 by increasing a distance between the edge of the first pixel electrode 114 and an opposite electrode 119 (see FIG. 9), thereby preventing the first pixel electrode 114 and the opposite electrode 119 from short circuiting.

FIG. 9 is a schematic cross-sectional view illustrating the organic light-emitting display device 1 formed by using the above-described method.

Referring to FIG. 9, the emission layer 118 may be formed on the first pixel electrode 114. The emission layer 118 may be, e.g., a low-molecular weight organic layer or a polymer organic layer. When the emission layer 118 is a low-molecular weight organic layer, a hole transport layer (HTL), a hole injection layer (HIL), an electron transport layer (ETL), an electron injection layer (EIL), and the like may be stacked around the emission layer 118. Various other layers may be stacked when necessary. A usable organic material may be any of various materials, e.g., copper phthalocyanine (CuPc), N'-Di(naphthalene-1-yl)-N, N'-diphenyl-benzidine (NPB), tris-8-hydroxyquinoline aluminum (Alq3), or the like.

When the emission layer 118 is a polymer organic layer, in addition to the emission layer 118, a HTL may be included. The HTL may be formed of, e.g., poly-2,4-ethylene-dihydroxy thiophene (PEDOT), polyaniline (PANI), or the like. A usable organic material may be poly-phenylenevinylene (PPV)-based, polyfluorene-based polymer organic material, or the like.

The opposite electrode 119 may be stacked on the emission layer 118 as, e.g., a common electrode. In the organic light-emitting display device 1 of the current embodiment, the first pixel electrode 114 may be used as an anode, and the opposite electrode 119 may be used as a cathode. However, embodiments are not limited thereto. For examples, polarities of the electrodes may be reversed.

The opposite electrode 119 may be a reflective electrode including a reflective material. At this time, the opposite electrode 119 may include at least one material selected from the group consisting of Al, Mg, Li, Ca, LiF/Ca, and LiF/Al.

Since the opposite electrode 119 may be a reflective electrode, light emitted from the emission layer 118 may be reflected by the opposite electrode 119, may pass through the first pixel electrode 114 formed of a transparent conductive material, and may be emitted toward the substrate 10. As described above, the buffer layer 11, which includes the insulating layers 11-1, 11-2, and 11-3 having different refractive indexes and may be formed under the first pixel electrode 114, may function as a DBR, thereby forming a resonance structure.

Without intending to be bound by this theory, in order to maximize a resonance effect, the thicknesses of the insulating layers 11-1, 11-2, and 11-3 functioning as the DBR may be less than about 700 Å. However, as described above, in order to increase device characteristics of the active layer 212 and the capacitor lower electrode 312 that are formed of polysilicon, silicon nitride having a great amount of hydrogen may be formed in the lower insulating layer 11-2 that does not contact the active layer 212 and the capacitor lower electrode 312, and the silicon oxide having a less amount of hydrogen may be formed as a protection layer so as to have a thickness of more than about 1000 Å on the uppermost insulating layer 11-3 contacting the active layer 212 and the capacitor lower electrode 312 in the transistor area TFT and the capacitor area CAP. Accordingly, the pixel area PXL, the transistor area TFT, and the capacitor area CAP may be formed to have different thicknesses, and thus the buffer layer 11 may function as a DBR and a protection layer of a display apparatus.

Accordingly, problems of a color reproduction range and an electrical property of the organic light-emitting display device 1 may be solved.

Figure 10:
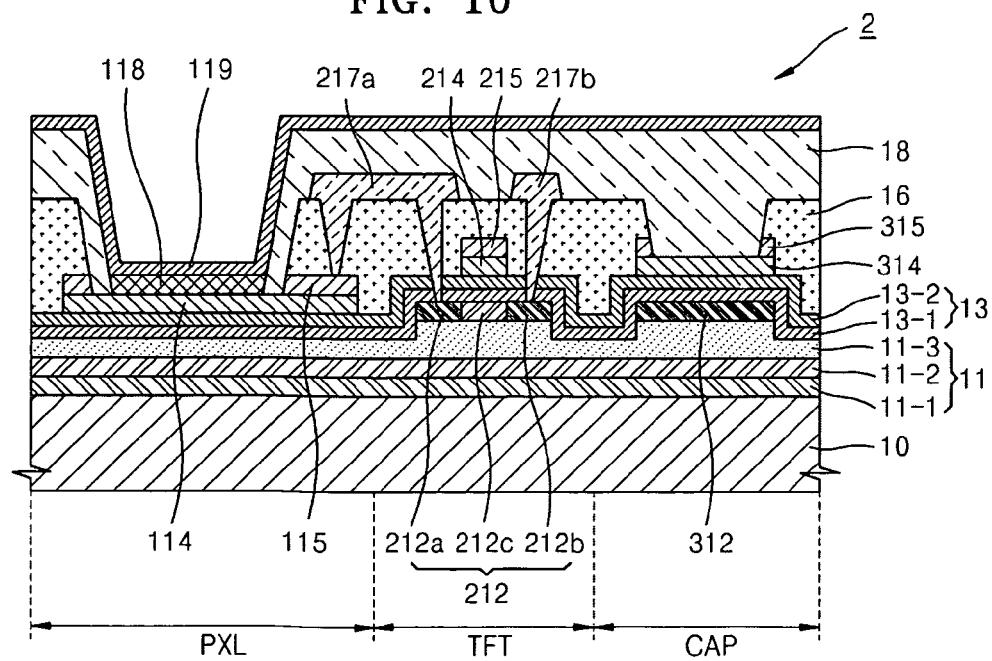
FIG. 10 is a schematic cross-sectional view illustrating an organic light-emitting display device, according to an exemplary embodiment.

FIG. 10 is a schematic cross-sectional view illustrating an organic light-emitting display device 2 according to another exemplary embodiment. Hereinafter, the organic light-emitting display device 2 relative to above discussion of the organic light-emitting display device 1 will be described.

Referring to FIG. 10, the buffer layer 11, including the insulating layers 11-1, 11-2, and 11-3, may be formed on the substrate 10, wherein the uppermost insulating layer 11-3 of the buffer layer 11 may be formed thick in the transistor area TFT and the capacitor area CAP and may be formed thin in the pixel area PXL. The uppermost insulating layer 11-3 may be formed to have a thickness of less than about 700 Å in the pixel area PXL and may be formed to have a thickness of more than about 1000 Å in the transistor area TFT and the capacitor area CAP.

The active layer 212 and the capacitor lower electrode 312 may be formed on the uppermost insulating layer 11-3 of the buffer layer 11, and the gate insulating layer 13, including a plurality of layers 13-1 and 13-2, may be formed to cover the active layer 212 and the capacitor lower electrode 312.

The gate insulating layer 13 may include the layers 13-1 and 13-2 having different refractive indexes. Thus, since the gate insulating layer 13 including the layers 13-1 and 13-2 having different refractive indexes and the buffer layer 11 including the insulating layers 11-1, 11-2, and 11-3 having different refractive indexes may be formed under the first pixel electrode 114, a DBR function of a resonance structure may be added, thereby further improving a color reproduction range.

In FIG. 10, the gate insulating layer 13 may be configured as a double-layered structure, but embodiments are not limited thereto. When the gate insulating layer 13 is too thick, it is difficult to form a channel, and the gate insulating layer 13 may function as a dielectric layer of a capacitor. Accordingly, if the gate insulating layer 13 is too thick, an electrostatic capacity may be decreased, and thus the entire thickness of the gate insulating layer 13 may not be too thick.

The layer 13-1 contacting the active layer 212 may be formed to have a less amount of hydrogen than the layer 13-2 that does not contact the active layer 212. For example, the layer 13-1 contacting the active layer 212 may be formed of silicon oxide, and the layer 13-2 that does not contact the active layer 212 may be formed of silicon nitride. Thus, the silicon nitride may cure a defect of the active layer 212 formed of polysilicon, and the silicon oxide may function as, e.g., a protection layer with respect to the silicon nitride.

In an organic light-emitting display device, a buffer layer, formed under a pixel electrode and an active layer, may be formed to have different thicknesses in a pixel area and a transistor area. Thus, characteristics of the organic light-emitting display device may be improved by solving a problem of a color reproduction range due to a resonance effect and curing defects in a crystal grain boundary. Also, in a mask process for patterning the active layer, the buffer layer is etched without using an additional mask process. Thus, a manufacturing process can be simplified. Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims

What is claimed is:

1. An organic light-emitting display device, comprising:
a buffer layer on a substrate, the buffer layer including a plurality of insulating layers having different refractive indexes, and an uppermost insulating layer of the insulating layers having different thicknesses;
an active layer of a thin film transistor overlapping a thick area of the uppermost insulating layer of the buffer layer, the active layer including side surfaces that are coplanar with side surfaces of the thick area of the uppermost insulating layer in a direction perpendicular to a surface of the substrate;
a pixel electrode overlapping a thin area of the uppermost insulating layer;
a gate electrode of the thin film transistor on the active layer;
source and drain electrodes of the thin film transistor connected to the active layer, a gate insulating layer being between the gate electrode and the source and drain electrodes;
an emission layer on the pixel electrode; and
an opposite electrode facing the pixel electrode, the emission layer being between the opposite electrode and the pixel electrode, wherein:
the uppermost insulating layer includes:
a first region including the thin area, the first region corresponding to the pixel electrode,
a second region including the thick area, the second region corresponding to the thin film transistor, and
a lower surface that extends at substantially a same level through the first region corresponding to the pixel electrode and through an entirety of the second region corresponding to the thin film transistor, and
each of the plurality of insulating layers of the buffer layer is under the active layer and the pixel electrode.

2. The organic light-emitting display device of claim 1, wherein:
a height of a portion of the uppermost insulating layer between the active layer and the substrate in the second region is greater than a height of another portion of the uppermost insulating layer between the pixel electrode and the substrate in the first region.

3. The organic light-emitting display device of claim 2, wherein the uppermost insulating layer of the buffer layer includes a lesser amount of hydrogen than another layer of the plurality of insulating layers of the buffer layer that is under the uppermost insulating layer, the active layer, and the pixel electrode.

4. The organic light-emitting display device of claim 3, wherein the active layer includes polysilicon, and the layer under the uppermost insulating layer of the buffer layer is filled in a defect site of the polysilicon so as to cure defects.

5. The organic light-emitting display device of claim 3, wherein the uppermost insulating layer of the buffer layer and the layer under the uppermost insulating layer include silicon oxide and silicon nitride, respectively.

6. The organic light-emitting display device of claim 1, wherein a cross-section of the thick area of the uppermost insulating layer has substantially a same shape as a cross-section of an etched surface of the active layer.

7. The organic light-emitting display device of claim 1, wherein from among the plurality of insulating layers, adjacent insulating layers have different refractive indexes.

8. The organic light-emitting display device of claim 1, wherein the gate insulating layer includes layers having different refractive indexes.

9. The organic light-emitting display device of claim 8, wherein from among the layers of the gate insulating layer, a layer contacting the active layer has a lesser amount of hydrogen than another layer that is in non-contacting relationship with the active layer.

10. The organic light-emitting display device of claim 9, wherein the active layer includes polysilicon, and the other layer that is in non-contacting relationship with the active layer is filled in a defect site of the polysilicon so as to cure defects.

11. The organic light-emitting display device of claim 8, wherein from among the layers of the gate insulating layer, a layer contacting the active layer and another layer that is in non-contacting relationship with the active layer include silicon oxide and silicon nitride, respectively.

12. The organic light-emitting display device of claim 1, wherein the pixel electrode includes a transparent electrode, and the opposite electrode includes a reflective electrode.

13. The organic light-emitting display device of claim 1, further comprising a lower electrode of a capacitor and an upper electrode of the capacitor, the lower electrode being formed of the same layer as the active layer and the upper electrode of a capacitor being formed of the same layer as the gate electrode, wherein:
   each of the plurality of insulating layers is under the capacitor, and
   the one of the insulating layers having difference thicknesses includes a third region including an additional thick area, the third region corresponding to the lower electrode of the capacitor.

14. The organic light-emitting display device of claim 13, wherein a cross-section of the lower electrode has a same shape as a cross-section of an etched surface of the thick area of the one of the insulating layers having the different thicknesses.

15. The organic light-emitting display device of claim 13, wherein:
   the gate insulating layer includes layers having different refractive indexes, and
   the lower electrode includes polysilicon, a layer contacting the lower electrode, from among the layers of the gate insulating layer, includes a lesser amount of hydrogen than another layer that is in non-contacting relationship with the lower electrode.

16. The organic light-emitting display device of claim 15, wherein the layer contacting the lower electrode and the other layer that is in non-contacting relationship with the lower electrode include silicon oxide and silicon nitride, respectively.

17. An organic light-emitting display device, comprising:
   a buffer layer on a substrate, the buffer layer including a plurality of insulating layers having different refractive indexes, and an uppermost insulating layer of the insulating layers having different thicknesses;
   an active layer of a thin film transistor overlapping a thick area of the uppermost insulating layer of the buffer layer, the active layer including side surfaces that are coplanar with side surfaces of the thick area of the uppermost insulating layer of the buffer layer in a direction perpendicular to a surface of the substrate;
   a pixel electrode overlapping a thin area of the uppermost insulating layer of the buffer layer;
   a gate electrode of the thin film transistor on the active layer;
   source and drain electrodes of the thin film transistor connected to the active layer, a gate insulating layer being between the gate electrode and the source and drain electrodes;
   an emission layer on the pixel electrode; and
   an opposite electrode facing the pixel electrode, the emission layer being between the opposite electrode and the pixel electrode,
   wherein each of the plurality of insulating layers are under the active layer and the pixel electrode.

18. The organic light-emitting display device of claim 17, wherein the active layer includes polysilicon, and the uppermost insulating layer of the buffer layer and the layer under the uppermost insulating layer include silicon oxide and silicon nitride, respectively.

19. The organic light-emitting display device of claim 17, wherein from among the plurality of insulating layers, adjacent insulating layers have different refractive indexes.

20. The organic light-emitting display device of claim 19, further comprising a lower electrode of a capacitor and an upper electrode of the capacitor, the lower electrode being formed of a same layer as the active layer and the upper electrode of a capacitor being formed of a same layer as the gate electrode, wherein:
   each of the plurality of insulating layers of the buffer layer is under the capacitor, and
   the lower electrode of the capacitor overlaps an additional thick area of the uppermost insulating layer of the buffer layer, the lower electrode including side surfaces that are coplanar with side surfaces of the additional thick area of the uppermost insulating layer of the buffer layer in a direction perpendicular to the substrate.

* * * * *